United States Patent [19]

Nishio

[11] 3,828,268

[45] Aug. 6, 1974

[54] DIFFERENTIAL AMPLIFIER HAVING INCREASED BANDWIDTH

[75] Inventor: Tomoyuki Nishio, Tokyo, Japan

[73] Assignee: Nippon Electric Company Limited, Tokyo, Japan

[22] Filed: Sept. 6, 1972

[21] Appl. No.: 286,760

[30] Foreign Application Priority Data

Sept. 7, 1971 Japan .............................. 46-68539

[52] U.S. Cl. .............. 330/30 D, 330/69, 330/38 M, 330/18

[51] Int. Cl. .............................................. H03f 3/68

[58] Field of Search ............................ 330/24, 30 D

[56] References Cited

UNITED STATES PATENTS 3,679,981 7/1972 Limberg ........................... 330/30 D 3,723,896 3/1973 Flickinger ........................ 330/24 X

*Primary Examiner*—Nathan Kaufman

*Attorney, Agent, or Firm*—Sandoe, Hopgood & Calimafde

[57] ABSTRACT

A differential amplifier is disclosed which includes a first pair of transistors of one conductivity type having impedance elements connected to their collectors. A second pair of transistors of an opposite conductivity type has emitters connected respectively to the emitters of the first pair of transistors and impedance elements connected to their collectors. A first output signal having a relatively high-frequency component is derived from the collector of one of the first pair of transistors, and a second output signal having a relatively low-frequency component is derived from the collector of one of the second pair of transistors.

5 Claims, 6 Drawing Figures

DIFFERENTIAL AMPLIFIER HAVING INCREASED BANDWIDTH

The present invention relates generally to differential amplifiers, and, more particularly, to a differential amplifier having an expanded frequency bandwidth.

A differential amplifier that includes a feed-forward circuit structure is known. In the known amplifier, the input signal is separated into a low-frequency portion and a high-frequency portion and at least the low-frequency portion is amplified. The two portions are superimposed on each other to achieve an expansion of the overall bandwidth for the amplifier.

Amplifiers of this type having a feed-forward circuit structure are exemplified by the integrated circuit devices "LM101A" and "LM301A" developed and manufactured by the National Semiconductor Corporation in the United States. Each of these devices has a pre-amplifier stage for amplifying only the low-frequency component of an input signal and a main amplifier stage for amplifying the output of the pre-amplifier stage and the input signal fed through a coupling capacitor bypassing the pre-amplifier stage, whereby the overall gain of the low-frequency component exceeds that of the high-frequency component, thereby to expand the frequency bandwidth of the amplifier.

The conventional amplifier of this kind has a capacitor connected in parallel with the pre-amplifier stage between the input terminal and the main amplifier stage. However, an amplifier having a capacitor is very difficult to manufacture in the form of a semiconductor integrated circuit device, because the required capacitor occupies a very large area and requires the provision of a greater number of terminals, thereby hampering miniaturization of the amplifiers.

It is, therefore, a principal object of this invention to provide a differential amplifier having a direct-coupled type circuit structure in which no capacitor is utilized.

It is another object of this invention to provide a differential amplifier capable of producing two mutually level-shifted output signals from one input signal.

It is a further object of the invention to provide a differential amplifier of the type described that is well suited for miniaturization in an integrated circuit.

The differential amplifier of this invention includes a first and a second transistors, the collectors of which are connected respectively to first and second load impedance elements. A third and a fourth transistors of a conductivity type opposite to that of the first and second transistors, have their emitters connected respectively to the emitters of the first and second transistors and their collectors connected respectively to third and fourth load impedance elements. The third and said fourth transistors are each in the grounded-base connection, and output means are connected respectively to the collectors of at least one of the first and second transistors and to the collectors of at least one of the third and fourth transistors.

In general, the cut-off frequencies of a pair of transistors of different conductivity types differ when the transistors are incorporated into an integrated circuit device. The present invention takes advantage of this difference in the cut-off frequency as a function on the conductivity type of the transistor. More specifically, the combination of the first and the second transistors and another combination of the third and fourth transistors are respectively assigned to the amplification of the high-frequency and low-frequency components so as to realize a wideband differential amplifier. This amplifier circuit of the invention thus makes it possible to derive two level-shifted output signals for a single base bias voltage of the transistor to which the input signal is applied. The present invention thus permits the direct coupling to subsequent stages without the need for capacitor coupling which is, indispensable in the conventional amplifier circuit.

The present invention will now be described in detail in conjunction with the accompanying drawings, wherein.

Figure 1:
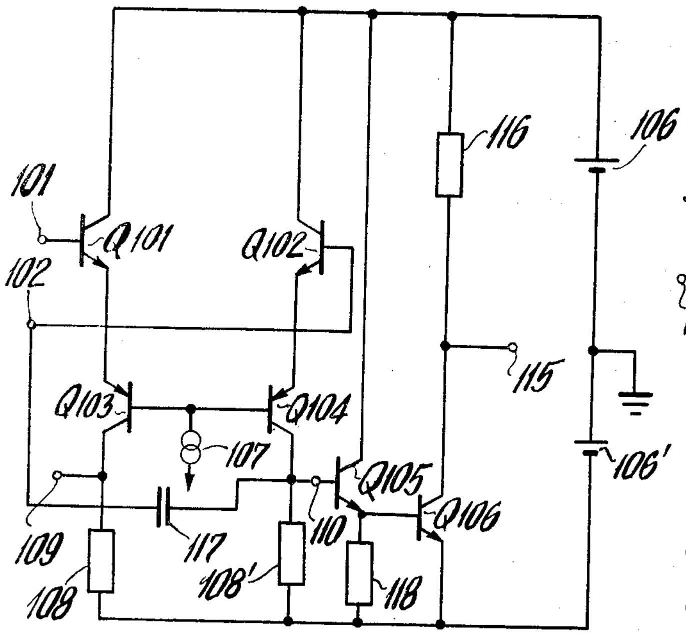
(PRIOR ART) FIG.1
FIG. 1 is a circuit diagram of a conventional wideband amplifier employing a feed-forward circuit.

In the conventional wideband amplifier illustrated in FIG. 1, a pair of NPN transistors Q101 and Q102 and a pair of PNP transistors Q103 and Q104 form a differential amplifier. The collectors of NPN transistors Q101 and Q102 are connected to the positive pole of a power source 106, and the collectors of PNP transistors Q103 and Q104 are connected to the negative pole of a power source 106′ through load impedance elements 108 and 108′, respectively. The base of PNP transistors Q103 and Q104 are coupled together to a constant-current source 107, so that transistors Q103 and Q104 function in the grounded-base connection.

Input terminals 101 and 102 are respectively connected to the bases of transistors Q101 and Q102, and the outputs of the differential amplifier are taken from terminals 109 and 110 which are in turn respectively connected to the collectors of PNP transistors Q103 and Q104. A capacitor 117 is coupled between terminal 110 and input terminal 102 and terminal 110 is also connected to the base of transistor Q105. The transistor Q105, in combination with a load impedance element 118 connected to its emitter, constitutes an emitter-follower. The emitter of transistor Q105 is connected to the base of transistor Q106 and load impedance element 116 and output terminal 115 are connected to the collector of transistor Q106.

In the conventional amplifier circuit shown in FIG. 1, the differential amplifier functions as a first amplification stage and the combination of transistors Q105 and Q106 functions as a second amplification stage. The differential amplifier is composed of two transistor pairs differing in conductivity type from each other. When incorporated into a single semiconductor device, one of the transistor pairs presents a smaller gain than the other pair, thereby narrowing the frequency bandwidth. Therefore, the differential amplifier is used as the amplification stage for the low frequency component, and the high-frequency signal is directly applied to terminal 110 through the capacitor 117. In the second-stage amplifier, the high-frequency and low-frequency signals are superimposed upon each other and amplified. The amplified output of the second-stage amplifier is obtained at output terminal 115. The gain of the second amplifier stage composed of a single amplification stage is low, but its frequency bandwidth is relatively broad. Moreover, since the first stage output contains no high-frequency component, adverse effects such as undesirable oscillation are avoided.

Stabilized amplification over a wide frequency band can thus be secured by the feed-forward circuit structure as shown in FIG. 1. In the conventional amplifier, however, the coupling capacitor 117 for the application of the high-frequency component to the second-stage amplifier is indispensable. As mentioned previously, the requirement of this capacitor in the conventional amplifier circuit makes it difficult to incorporate the circuit into an integrated circuit device since the capacitor, occupies a substantial area on the substrate thereby hampering miniaturization of the circuit.

Figure 2:
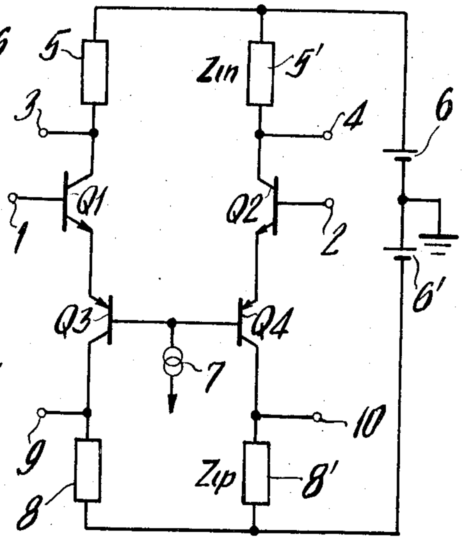
FIG. 2 is a circuit diagram of an amplifier according to a first embodiment of this invention.

In the first embodiment of this invention as shown in FIG. 2, the collectors of NPN transistors Q1 and Q2 are connected to the positive pole of a power source 6 through load impedance elements 5 and 5', respectively. The bases of transistors Q1 and Q2 are respectively connected to input terminals 1 and 2. The emitters of PNP transistors Q3 and Q4 are respectively connected to the emitters of NPN transistors Q1 and Q2, and collectors of transistors Q3 and Q4 are connected to the negative pole of a power source 6' through load impedance elements 8 and 8', respectively.

The bases of transistors Q3 and Q4 are connected to a common constant-current source 7 so that these transistors function as a grounded-base amplifier. Output terminals 3, 4, 9, and 10 are respectively coupled to the collectors of transistors Q1, Q2, Q3, and Q4. Since PNP transistors Q3 and Q4 constitute a grounded-base amplification stage with respect to the NPN transistors Q1 and Q2, the collector current variation at NPN transistors Q1 and Q2 caused by the input from input terminal 1 is expressed as $Vi/2r_e$, where $r_e$ denotes the forward emitter differential resistance of each of the transistors Q1 through Q4. Where the input signal voltage is applied to NPN transistor Q1 in such a sense that the voltage increases in response to a variation, the collector current of transistor Q2 decreases by an amount equal to the variation. Therefore, two outputs which are equal in magnitude, $Z_{1n} \cdot Vi/2\ r_e$, and opposite in phase are obtained at output terminals 3 and 4, where $Z_{1n}$ denotes the impedance value of each of the load impedance elements 5 and 5' respectively connected to the collectors of NPN transistors Q1 and Q2.

The amplified outputs obtained at output terminals 9 and 10 now be considered. The PNP transistors Q3 and Q4, when incorporated into a semiconductor integrated circuit device as considered to have an equal gain and frequency response. In the embodiment of FIG. 2, the bases of PNP transistors Q3 and Q4 are connected in common to a constant-current source 7. The collector current variation of PNP transistors Q3 and Q4 caused by the inputs to the bases of NPN transistors Q1 and Q2 is therefore given by $Vi/2\ r_e$ and the output voltages at output terminals 9 and 10 will be equal in magnitude, $Z_{1p} \cdot Vi/2\ r_e$, and opposite in phase, where both load impedance elements 8 and 8' are assumed to have the same impedance $Z_{1p}$.

When NPN and PNP transistors are both formed in one semiconductor substrate, the cutoff frequency $f_T$ of the current gain of either transistor becomes invariably lower than that of the other. When the amplifier circuit of the present invention is realized as a semiconductor integrated circuit device using an N-type silicon substrate, the value of $f_T$ of PNP transistors Q3 and Q4 becomes markedly lower than that of the NPN transistors Q1 and Q2. As a consequence, no high-frequency component is contained in the outputs derived from the output terminals 9 and 10. This holds true regardless of whether a PNP transistor has an emitter and collector disposed laterally (in the manner disclosed in the U.S. Pat. Nos. 3,197,710 and 3,412,460) or longitudinally (in the manner disclosed in the Dutch Pat. Publication No. 6,614,858). On the other hand, since the NPN transistors Q1 and Q2 are of conventional structure, signals derived from output terminals 3 and 4 have a sufficiently wide frequency bandwidth.

The description thus far given is of the alternating-current operation of the amplifier of FIG. 2. As to the DC operation of the circuit, it will be evident that output terminals 3 and 4 are of the same potential and accompanied by a level shift of a certain positive value with respect to the bases of NPN transistors Q1 and Q2, and that output terminals 9 and 10 are accompanied by a negative level shift with respect to the bases of NPN transistors Q1 and Q2. Therefore, the differential amplifier according to this invention provides two separate amplified outputs with positive and negative direct-current level shifts.

Since these two outputs can be easily superimposed on each other by direct coupling with subsequent amplifier stages, the capacitive coupling means for the superimposition required in the conventional circuits can be dispensed with, and the amplifier having a feed-forward circuit structure as in the present invention can be readily fabricated as an integrated circuit device.

Differential amplifiers are frequently used as operational amplifiers for DC amplification. The differential amplifier of this invention is capable of securing the bandwidth expansion effect as a result of the feed-forward circuit structure without sacrificing DC amplification.

Figure 6:
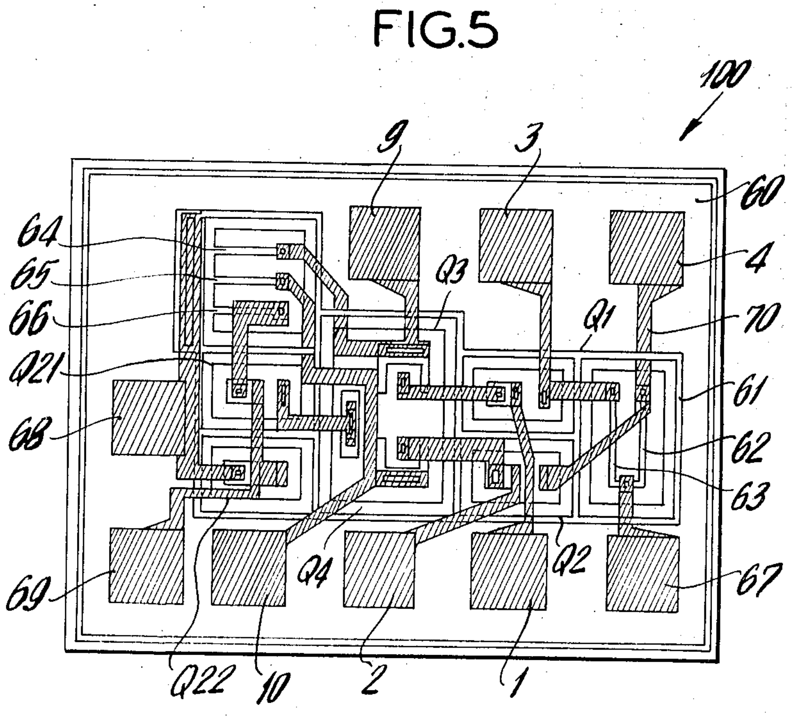
FIG. 6 is a plan view of a semiconductor integrated circuit device embodying the embodiment of this invention illustrated schematicallly in FIG. 2.

A plan view of a semiconductor integrated circuit device incorporating a differential amplifier equivalent to the embodiment of FIG. 2 is shown in FIG. 6 in which, the semiconductor integrated circuit device 100 has a substrate 60 having an N-type silicon epitaxial layer grown on a P-type silicon substrate. Circuit elements such as transistors and resistors are individually isolated by the isolation region 61 formed by diffusing P-type impurities into the substrate. More specifically, NPN transistors Q1, Q2, Q21 and Q22, PNP transistors Q3 and Q4, and resistor portions 62–63 and 64–66 are formed on the substrate 60 so as to be isolated from one another by the region 61. After the completion of this process, metal wiring 70 the (hatched portion in the drawing) is provided in such a manner that it laterally crosses the isolation layer to constitute the circuit shown in FIG. 2.

In an operational amplifier employing a differential amplifier, the input resistance must be made sufficiently large. The input resistance is expressed as $2\ r_e \cdot h_{FE}$, where $h_{FE}$ denotes the current gain of the input stage transistor and $r_e$ denotes the emitter differential resistance of the transistor at the bias current level under operation. Therefore, the input resistance increases with a decrease in the DC bias current to increase the emitter differential resistance $r_e$ and the current gain $h_{FE}$ of the input stage transistor. However, since these requirements are incompatible, the current gain of the amplifier decreases with an increase in the emitter differential resistance $r_e$.

Figure 3:
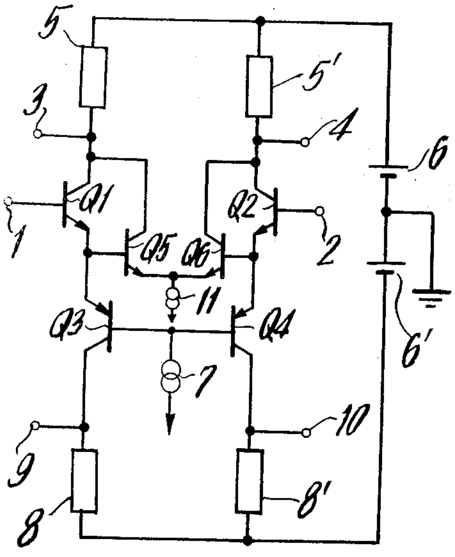
FIG. 3 is a circuit diagram of an amplifier according to a second embodiment of this invention.

FIG. 3 illustrates another embodiment of this invention in which both the gain and the input resistance is increased by overcoming the two incompatible requirements mentioned above. In this embodiment, NPN transistors Q5 and Q6 as well as a constant-current source 11 are added to the differential amplifier of FIG. 2. Collectors and bases of the NPN transistors Q5 and Q6 are respectively connected to the collectors and emitters of NPN transistors Q1 and Q2, and their emitters are connected in common to the constant-current source 11. The embodiment of FIG. 3 is aimed at than increase in the current gain of the differential amplifier by conducting relatively large currents in NPN transistors Q5 and Q6 to decrease the emitter differential resistance $r_e$, while increasing the input resistance of the amplifier by reducing the bias currents in NPN transistors Q1 and Q2 to increase the emitter differential resistance $r_e$. According to this embodiment, therefore, the current gain for the outputs obtained at output terminals 3 and 4 is substantially controlled only by the current gain of NPN transistors Q5 and Q6, and the input resistance is substantially controlled only by the emitter differential resistance $r_e$ and the current gain $h_{FE}$ of NPN transistors Q1 and Q2. Therefore, both the current gain and the input resistance values can be made sufficiently large. The current gain for the outputs available from output terminals 9 and 10 may be improved by substituting transistors for the load impedance elements 8 and 8'.

Figure 4:
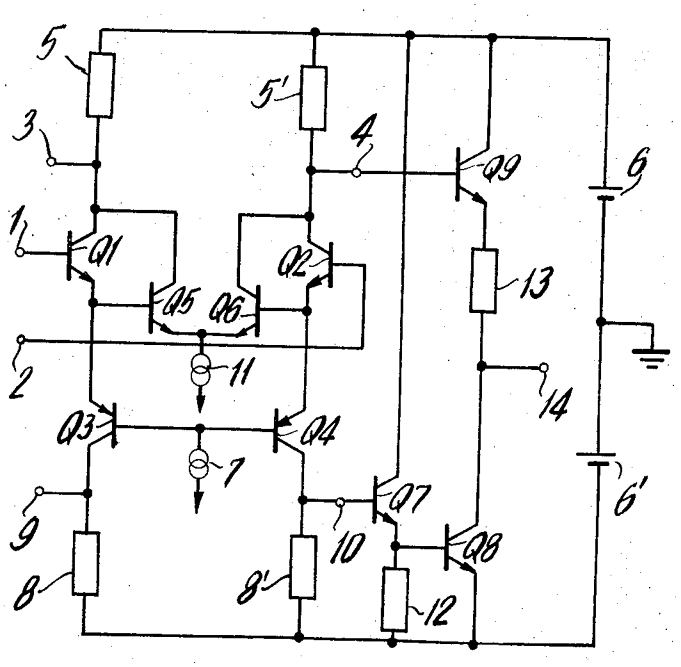
FIGS. 4 and 5 are circuit diagrams of first and second examples of amplifiers in which the differential amplifier of this invention is applied.

Referring to the embodiment of the invention shown in FIG. 4, terminals 4 and 10 are the output terminals for the high-frequency amplification and the low-frequency amplification sections of the first-stage amplifier, respectively. A signal supplied from output terminal 4 is fed to the base of an NPN transistor Q9 and delivered to output terminal 14 from its emitter through an impedance element 13. The collector of transistor Q9 is connected to the positive pole of a power source 6 whereby transistor Q9 functions as an emitter-follower amplifier. A signal from output terminal 10 is fed to the base of an NPN transistor Q7 and is delivered to output terminal 14 from the emitter of transistor Q7 through the base and the collector of an NPN transistor Q8. The collector and the emitter of NPN transistor Q7 are connected respectively to the positive pole of a power source 6 and the negative pole of a power source 6' through a load impedance element 12, whereby transistor Q7 operates as an emitter-follower amplifier. The collector of NPN transistor Q8 is connected to the emitter of NPN transistor Q9 via a load impedance element 12. If the signals applied to the bases of NPN transistors Q8 and Q9 are made opposite in phase, a superimposed signal of the individual output signals of the high-frequency and low-frequency amplification sections is obtained from the output terminal 14.

As will be evident from the foregoing description, the differential amplifier of this invention is capable of superimposing high-frequency and low-frequency components without resorting to a coupling capacitor in the feed-forward circuit structure.

Figure 5:
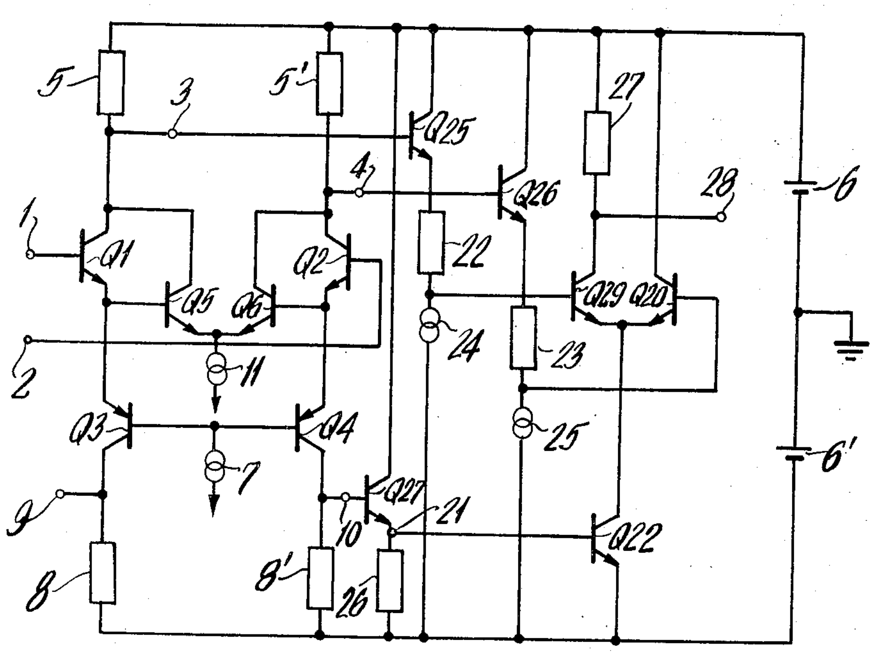

Referring to FIG. 5 in which there is illustrated another example of an amplifier having the differential amplifier of FIG. 3, output terminals 3 and 4 of the differential amplifier are respectively connected to the bases of NPN transistors Q25 and Q26 constituting an emitter-follower. The collectors of NPN transistors Q25 and Q26 are connected in common to the positive pole of a power source 6, and the emitters of transistors Q25 and Q26 are connected in common to the negative pole of a power source 6' through impedance element 22 and constant-current source 24, and impedance element 23 and constant-current source 25, respectively. The outputs of transistors Q25 and Q26 are level-shifted by the series combinations of the impedance element 22- the constant-current source 24 and the impedance element 23- the constant-current source 25, and are then derived from the junctions of the impedance element 22- the constant-current source 24 and the impedance element 23- the constant-current source 25 to be applied to the bases of NPN transistors Q29 and Q20, respectively which constitute a differential amplifier whose output is derived from the collector of transistor Q29. An impedance element 27 serves as a load to transistor Q29.

On the other hand, the output terminal 10 of the differential amplifier is connected to the base of NPN transistor Q27 whose collector and emitter are respectively connected to the positive pole of the power source 6 and the negative pole of the power source 6' through a load impedance element 26 to function as an emitter-follower amplifier. The base of an NPN transistor Q22 is connected to the junction of the emitter of an NPN transistor Q27 and the load impedance element 26. The emitter of the NPN transistor Q22 is also connected to the negative pole of the power source 6' and the collector of that transistor is connected to the junction of the emitters of NPN transistors Q20 and Q29 which constitute the differential amplifier of the output stage.

As will be evident from this circuit structure, the high-frequency component separated in the differential amplifier of this invention is applied to the differential amplifier consisting of NPN transistors Q20 and Q29, from output terminals 3 and 4 through NPN transistors Q25 and Q26 to undergo amplification and to be derived from the output terminal 28. On the other hand, the low-frequency component is fed from the output terminal 10 to NPN transistor Q22 through NPN transistor Q27 to undergo amplification and to be derived from the output terminal 28. The differential amplifier consisting of NPN transistors Q20 and Q29 functions as an ordinary differential amplifier for the high-frequency component, but serves as a grounded-base amplifier for the low-frequency component which has been amplified by the NPN transistor Q22. Accordingly, the amplified output in which the high-and low-frequency components are superimposed on each other is derived from whichever side of the two collectors of NPN transistors Q20 and Q29 the high-and low-frequency components are in phase. In the circuit of FIG. 4, both components are in phase at the collector of NPN transistor Q29.

While only a few examples of the present invention in a direct-coupled multi-stage amplifier circuit have been described it will be obvious to those skilled in the art that this invention can find application in an ordinary differential amplifier used to reduce voltage drift.

What is claimed is:

1. A differential amplifier comprising first and second input terminals, first and second transistors of NPN type having bases connected respectively to said first and second input terminals, the collectors of said first and second transistors being connected respectively through first and second load impedances to one terminal of a power supply, third and fourth transistors of PNP type having bases connected to a first constant-current source, the collectors of said third and fourth transistors being connected respective through third and fourth load impedances to the other terminal of said power supply, the emitters of said third and fourth transistors being connected respectively to the emitters of said first and second transistors, fifth and sixth transistors of NPN type having collectors connected respectively to the collectors of said first and second transistors, the bases of said fifth and sixth transistors being connected respectively to the emitters of said first and second transistors, a second constant-current source connected to the emitters of said fifth and sixth transistors, first output signal deriving means connected to the collector of one of said first and second transistors, and second output signal deriving means connected to the collector of one of said third and fourth transistors, whereby a high-frequency component of an amplified signal applied to said first and second input terminals is derived from said first output signal deriving means, and a low-frequency component of the amplified signal is derived from said second output signal deriving means.

2. The differential amplifier as claimed in claim 1, wherein said third and said fourth transistors are each made of a transistor having a collector region and an emitter region disposed laterally thereto.

3. The differential amplifier as claimed in claim 1, which is fabricated in the form of an integrated circuit device.

4. The differential amplifier of claim 1, further comprising seventh and eighth transistors of NPN type, the bases of said seventh and eighth transistors being connected respectively to said first and second output signal deriving means, the collectors of said seventh and eighth transistors being connected to said one terminal of said power supply, the emitter of said eighth transistor being connected through a sixth load impedance to the other terminal of said power supply, a ninth transistor of NPN type having a collector connected through a fifth load impedance to the emitter of said seventh transistor, the base of said ninth transistor being connected to said emitter of said eighth transistor, the emitter of said ninth transistor being connected to the other terminal of said power supply, and an output terminal connected to said collector of said ninth transistor, whereby the high-frequency component of the amplified signal derived from said first output signal deriving means is further amplified by said seventh transistor and sent to said output terminal, the low-frequency component of the amplified signal derived from said second output signal deriving means being further amplified by said eighth and ninth transistors and sent to said output terminal, and the high-frequency component and the low-frequency component of the further amplified signal being superposed at and derived from said output terminal.

5. The differential amplifier of claim 1, further comprising third output signal deriving means connected to the other of the collectors of said first and second transistors and producing a high-frequency component of the amplified signal, an output terminal, seventh and eighth transistors of NPN type having bases connected respectively to said first and third output signal deriving means, the collectors of said seventh and eighth transistors being connected to said one terminal of said power supply, the emitters of said seventh and eighth transistors being connected respectively through fifth and sixth load impedances and third and fourth constant-current sources to said other terminal of said power supply, a ninth transistor having a base connected to said second output signal deriving means, the collector of said ninth transistor being connected to said one terminal of said power supply, the emitter of said ninth transistor being connected through a seventh load impedance to said other terminal of said power supply, tenth and eleventh transistors of NPN type having bases connected respectively to the junction of said third and fourth constant-current sources and said fifth and sixth load impedances, the collector of said tenth transistor being connected to said output terminal and through an eighth load impedance to said one terminal of said power supply, the collector of said eleventh transistor being connected directly to said one terminal of said power supply, and a twelfth transistor of NPN type having a base connected to the emitter of said ninth transistor, the collector of said twelfth transistor being connected to the emitters of said tenth and eleventh transistors, the emitter of said twelfth transistor being connected to said other terminal of said power supply, whereby the high-frequency component of the amplified signal derived from said first and third output signal deriving means is further amplified by said seventh, eighth, tenth and eleventh transistors, the low-frequency component of the amplified signal derived from said second output signal deriving means is further amplified by said ninth and twelfth transistors, and the further amplified high-frequency component and the further amplified low-frequency component are superimposed at and derived from said output terminal.

* * * * *